(12) United States Patent
Wu et al.

(10) Patent No.: US 8,452,439 B2
(45) Date of Patent: May 28, 2013

(54) DEVICE PERFORMANCE PARMETER TUNING METHOD AND SYSTEM

(75) Inventors: Sunny Wu, Zhudong Town (TW);
Chun-Hsien Lin, Hsinchu (TW);
Kun-Ming Chen, Hsinchu (TW);
Dung-Yian Hsieh, Hsinchu (TW);
Hui-Ru Lin, Fengyuan (TW); Jo Fei Wang, Hsinchu (TW); Jong-I Mou, Hsinpu Township, Hsinchu County (TW); I-Ching Chu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 296 days.

(21) Appl. No.: 13/048,282

(22) Filed: Mar. 15, 2011

(65) Prior Publication Data
US 2012/0239178 A1   Sep. 20, 2012

(51) Int. Cl.
G06F 19/00    (2011.01)
G01N 37/00    (2006.01)
G06F 11/30    (2006.01)
G21C 17/00    (2006.01)

(52) U.S. Cl.
USPC ........... 700/110; 700/104; 700/108; 700/109; 702/84; 702/182; 702/185

(58) Field of Classification Search
USPC ............ 700/104, 108–110; 702/84, 182–183, 702/185
See application file for complete search history.

(56) References Cited

U.S. PATENT DOCUMENTS

| | | | |
|---|---|---|---|
| 5,655,110 A * | 8/1997 | Krivokapic et al. | 700/95 |
| 5,939,886 A * | 8/1999 | Turner et al. | 324/464 |
| 6,977,517 B2 * | 12/2005 | Miao et al. | 324/750.05 |
| 7,915,055 B2 * | 3/2011 | Kurihara et al. | 438/14 |
| 8,295,965 B2 * | 10/2012 | Wu et al. | 700/102 |
| 2003/0006413 A1 * | 1/2003 | Chawla et al. | 257/48 |
| 2006/0100844 A1 * | 5/2006 | Yang et al. | 703/21 |
| 2006/0241802 A1 * | 10/2006 | Chen et al. | 700/121 |
| 2007/0238204 A1 * | 10/2007 | Kurihara et al. | 438/14 |
| 2010/0010768 A1 * | 1/2010 | Good et al. | 702/117 |
| 2010/0141948 A1 * | 6/2010 | Cohen et al. | 356/369 |
| 2013/0013097 A1 * | 1/2013 | Wu et al. | 700/100 |

* cited by examiner

*Primary Examiner* — Ramesh Patel
(74) *Attorney, Agent, or Firm* — Duane Morris LLP; Steven E. Koffs

(57) ABSTRACT

A method comprises computing respective regression models for each of a plurality of failure bins based on a plurality of failures identified during wafer electrical tests. Each regression model outputs a wafer yield measure as a function of a plurality of device performance variables. For each failure bin, sensitivity of the wafer yield measure to each of the plurality of device performance variables is determined, and the device performance variables are ranked with respect to sensitivity of the wafer yield measure. A subset of the device performance variables which have highest rankings and which have less than a threshold correlation with each other are selected. The wafer yield measures for each failure bin corresponding to one of the selected subset of device performance variables are combined, to provide a combined wafer yield measure. At least one new process parameter value is selected to effect a change in the one device performance variable, based on the combined wafer yield measure. The at least one new process parameter value is to be used to process at least one additional wafer.

13 Claims, 7 Drawing Sheets

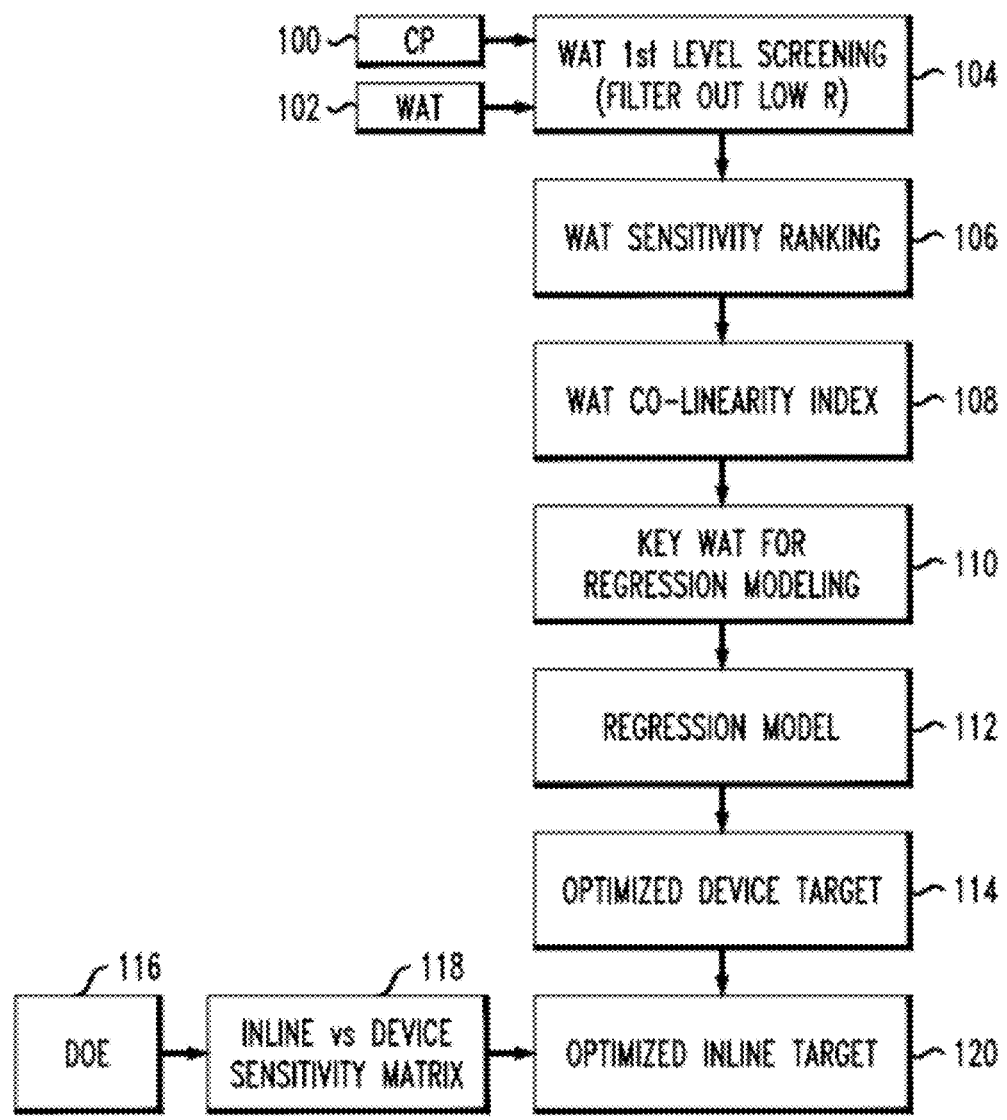

BIN23 (LEAKAGE)

BIN11 (SPEED)

FIG. 3

$$\begin{bmatrix} S(x_1 \mid x_1, x_1) & S(x_1 \mid x_1, x_2) & \cdots & S(x_1 \mid x_1, x_N) \\ 0 & S(x_2 \mid x_2, x_2) & \cdots & S(x_2 \mid x_2, x_N) \\ \vdots & \ddots & \ddots & \vdots \\ 0 & \cdots & 0 & S(x_2 \mid x_N, x_N) \end{bmatrix}$$

MATRIX 1

$$\begin{bmatrix} S(x_1 \mid x_1, x_1) & S(x_2 \mid x_1, x_2) & \cdots & S(x_N \mid x_1, x_N) \\ 0 & S(x_2 \mid x_2, x_2) & \cdots & S(x_N \mid x_2, x_N) \\ \vdots & \ddots & \ddots & \vdots \\ 0 & \cdots & 0 & S(x_N \mid x_N, x_N) \end{bmatrix}$$

MATRIX 2

DEVICE PERFORMANCE PARMETER TUNING METHOD AND SYSTEM

FIELD

The present disclosure relates to semiconductor device fabrication generally, and more specifically to yield monitoring.

BACKGROUND

Maintaining a high yield in semiconductor fabrication processes continues to be a critical factor in reducing the costs of device fabrication. The continuous trend to increase integration and reduce feature size increases the complexity of maintaining process conditions that result in devices which satisfy specifications with high yield.

Once the design of an integrated circuit (IC) is completed and a mask set and process recipe have successfully produced chips with high yield, the challenges are not finished. Process conditions and/or tool function can change or drift over time, resulting in changes, which may cause an unacceptable level of chip failures. For example, a change in a tool that increases a line width can change timing, resulting in failure to meet a specification requirement.

Once a change in chip yield is observed, finding a solution is a difficult task. There may be many different reasons for the decline in yield, and the change in yield may be the result of a combination of parameters, which can independently cause yield reductions and/or may interact with each other. When a substantial fraction of the chips fail to meet a particular type of specification (e.g., speed, transistor leakage current), the chips that fail that same type of specification are grouped into a "failure bin".

In some cases it is possible to identify a "key device" or performance parameter, such as transistor saturation current that is relevant to a particular failure bin. In such cases, modifying the key device parameter through a process recipe change may improve yield (at least for that failure bin). It may be hard to identify a key device if there is no significant shift due to any single recipe change.

In some cases, the decline in device yield is due to random defects (such as a unacceptable particle infiltration into the processing tool, causing short circuits between adjacent lines). In these situations, there is no "key device", and the nature of the solution to improve yield is very different.

Engineering analysis takes a long time to identify the solution(s) that will restore the production line to an acceptable yield level. This problem is especially difficult if there are multiple reasons for the decline in yield. Engineers may be required to manually check hundreds of electrical parameters. Until this analysis is completed, yield problems continue, and many unacceptable chips may by produced, which can cause serious impact to costs and/or delivery schedules.

Improved methods and tools for analyzing yield problems are desired.

BRIEF DESCRIPTION OF THE DRAWINGS

FIG. 1 is a block diagram of a method and system for device performance parameter tuning.

FIG. 3 is a diagram showing the two sensitivity matrices and an example of a row and column to be multiplied during sensitivity analysis.

DETAILED DESCRIPTION

Figure 2B:
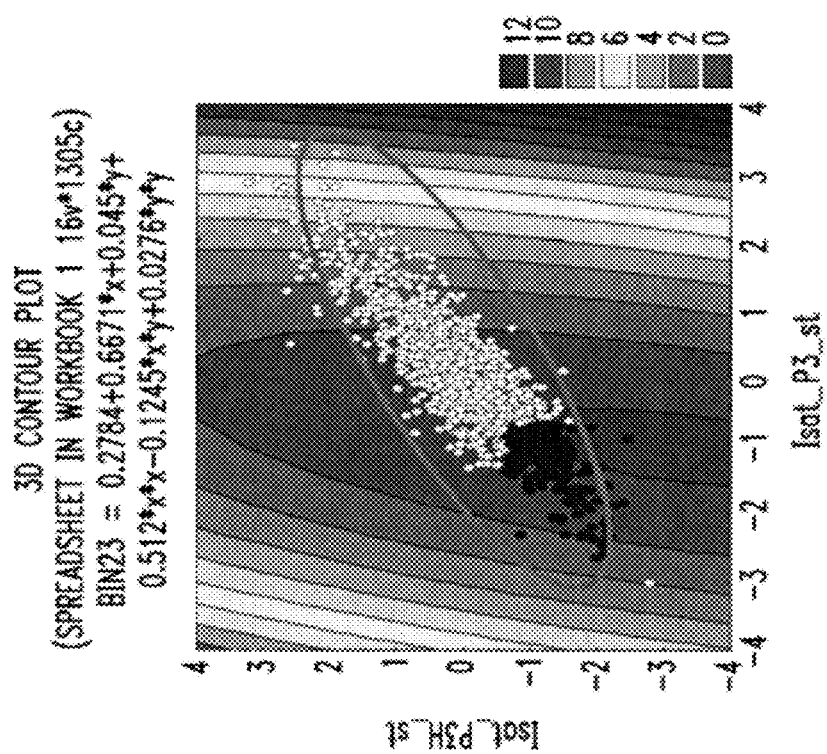
FIGS. 2A and 2B are contour diagrams of wafer acceptance test (WAT) data and regression contours based on the WAT data.

This description of the exemplary embodiments is intended to be read in connection with the accompanying drawings, which are to be considered part of the entire written description.

A method and system are disclosed to identify optimized targets for multiple device performance variables to achieve maximum yield and minimum chip failure rate.

Given a plurality of specific (or grouped) good/bad bins, the method prioritizes key device performance variables from wafer acceptance test (WAT) data by sensitivity (where the sensitivity quantifies expected impact of a change in that device performance variable upon yield or failure rate). The device performance variables are ranked according to sensitivity, and a relatively small subset of the device performance variables having the highest yield (failure rate) impact for each failure bin are identified. A WAT co-linearity check is made to determine which of the subset of highest ranked device performance variables for the same failure bin are highly correlated with each other. If any two or more of the highest ranked device performance variables for the same failure bin are correlated with each other, only the highest ranked one of the correlated variables is further considered in the analysis. Regression models are separately developed for each of the remaining highest ranked independent device performance variables for each failure bin. The regression models for a given device performance variable corresponding to multiple failure bins are then combined to generate a contour function representing the failure count across multiple failure bins as a function of those device performance variables.

An optimized device performance target for those multiple device performance variables is then calculated, considering all the regression models for each device performance variable and the key WAT data distributions. Generally, the device performance variable values which minimize total failures across the failure bins (or maximize yield) are selected, subject to one or more constraints. For example, the range of the device performance variable is limited by the actual practical range of the processing tools. Further, preference may be given to device performance targets that are closest to the current process targets, to minimize risk of large changes to the recipe. Given the new device performance target, the process recipe changes are determined based on empirical data collected through design of experiment during process technology development. New inline process targets are then determined based on the "inline to device sensitivity matrix".

FIG. 1 is a flow chart summarizing an embodiment of a method.

At block 100, chip probe (CP) tests are performed and data collected.

At block 102, wafer acceptance test (WAT) data are collected from production wafers that have completed production. From these data, the yield is determined. Wafers that fail to satisfy a common performance specification are grouped into a failure bin. For example, a plurality of wafers for which the IC's do not satisfy I/O bus speed specifications may be grouped into the same failure bin.

At block 104, a first level of analysis and filtering is performed. A respective regression model is computed for each of a plurality of failure bins based on a plurality of failures identified during the wafer electrical tests. Each regression model outputs a wafer yield measure as a function of a plurality of device performance variables.

As a threshold filter, if there is less than a threshold correlation between a device performance parameter and the failure count in the failure bin of interest, that device performance parameter can be eliminated from consideration. Typically, absolute value of correlation coefficient, R=0.2, may be used as threshold value, Once |R| of device performance parameter is less than 0.2, it would be eliminated from further consideration. For example, in some embodiments, during WAT, about 1000 to 2000 performance parameters are measured, but only about 50 to 70 of those performance parameters are correlated with a particular failure bin. The remaining 930 to 1950 performance parameters are eliminated from consideration at step 104, based on a low correlation coefficient.

Figure 2A:
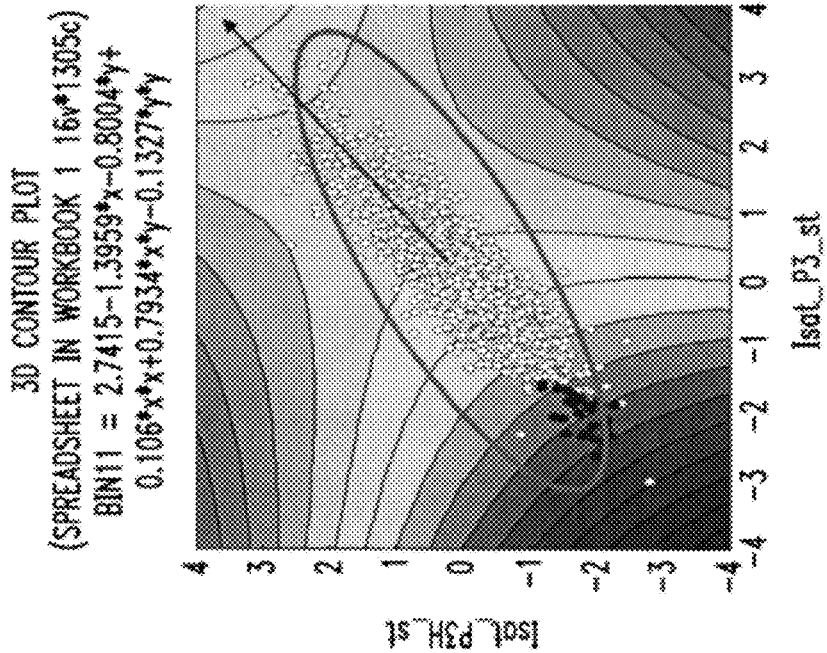

In some embodiments, the regression models are based on pairs of input variables. FIGS. 2A and 2B show examples of two regression models for yield as a function of transistor saturation current. FIG. 2A is a contour plot for a failure bin in which IC's failed to satisfy an I/O bus speed specification. The X axis variable (abscissa) measures saturation current for a small threshold voltage (Vt) transistor, and the Y axis variable (ordinate) measures saturation current for a high Vt transistor. Because the relevant range of values for these two performance measures may not be of the same order of magnitude, the data are normalized with respect to the standard deviation of each variable. Thus, the abscissa measures a number of standard deviations of saturation current for the small Vt transistors, and the ordinate measures a number of standard deviations of saturation current for the high Vt transistors. The shaded contours show a second order best fit regression for the failure rate (Z values), measured by failure counts during WAT, as a function of the two input variables X and Y. In FIG. 2A, the contour is defined by the equation:

$$BIN11 = 2.7415 - 1.3959*x - 0.8004*y + 0.106*x^2 + 0.7934*x*y - 0.1237*y^2 \quad (1)$$

For example, the failure count is generally highest (lower left corner) when the saturation current is small for both low and high Vt transistors, and lowest (upper left and lower right corners) when the saturation current is high for either one of the low and high Vt transistors and low for the other one of the low and high Vt transistors. It is apparent upon visual inspection that the Z values of the contour are roughly symmetric about the 45 degree (Y=X) line.

In FIG. 2A, a scatter plot of the actual WAT data is superimposed on the regression contour. The data points corresponding to failed wafers are indicated by solid black circles, and the data points corresponding to wafers with acceptable I/O bus speed are indicated by empty white circles. Most of the wafers for which the low and/or high Vt transistor saturation current is more than one standard deviation below the mean fail to satisfy the I/O bus speed specification.

FIG. 2B is a contour plot for another failure bin, in which wafers failed to meet a leakage current specification. The Z value indicated by the contour bands represents failure counts. The abscissa and ordinate scales are the same as in FIG. 2A, showing low and high Vt transistor saturation current normalized to a standard deviation scale (although the absolute value of the standard deviations for each of the failure bins are generally different from each other, and may differ by one or more orders of magnitude). The shaded contours show a best fit regression for the failure count. The contour bands are nearly vertical, which suggests a that the low Vt transistor saturation current has a greater impact on the failure count than the high Vt transistor saturation current. In FIG. 2B, the contour is defined by equation (2), which is similar in form to equation (1).

$$BIN23 = 0.2784 - 0.6671*x + 0.045*y + 0.512*x^2 - 0.1245*x*y + 0.0276*y^2 \quad (2)$$

For the 50 to 70 device performance parameters correlated to failure count, additional information besides the correlation coefficient is relevant to the analysis. The correlation coefficient indicates the degree to which the test data conform to a best fit regression curve, and is thus sensitive to noise in the measured signals. For purpose of selecting new device performance targets to improve the overall yield of the wafers, a sensitivity analysis is performed.

The sensitivity may be defined as follows:

$$S = \frac{\Delta FailureRate}{\Delta \sqrt{E[(y-\hat{y})^2]}}, \quad (3)$$

$$S \neq f(\bar{y} \propto \{y \mid y \in \text{noise}\})$$

where y is the device performance parameter value. Thus, S is given by the change in the wafer failure count divided by the change in the device performance parameter (when the device performance parameter is normalized and expressed in terms of standard deviations from its mean value).

For the sensitivity analysis herein, for a failure count function $y = f(x_i, x_j)$, where $x_i$ and $x_j$ are two device performance parameters, the sensitivity is defined as the partial derivative of the failure count function with respect to one of the device performance parameters $x_i$ and $x_j$ evaluated at the midpoint of the range of that parameter:

$$S(x_i | x_i, x_j) = df(x_i, x_j)/dx_i |_{x_i = \bar{x}_i},$$

$$S(x_j | x_i, x_j) = df(x_i, x_j)/dx_j |_{x_j = \bar{x}_j} \quad (4)$$

In other words, sensitivity is the gradient of the slope of the contour plot in the center of the plot. Thus, the sensitivity is the slope of the failure count function with respect to one of the device performance parameters in a plane through the midpoint of that parameter. For every pair of device performance parameters, two sensitivity values can be generated by equations (2). Given one failure bin with N device performance parameters that are correlated with the failure count, two N×N Sensitivity matrices are then generated. Several of the terms have values of zero, so that there are N(N−1)/2 ($x_i, x_j$) combinations of sensitivity having non-zero elements in the matrices.

$$\begin{bmatrix} S(x_1 | x_1, x_1) & S(x_1 | x_1, x_2) & \cdots & S(x_1 | x_1, x_N) \\ 0 & S(x_2 | x_2, x_2) & \cdots & S(x_2 | x_2, x_N) \\ \vdots & \ddots & \ddots & \vdots \\ 0 & \cdots & 0 & S(x_N | x_N, x_N) \end{bmatrix} \quad (A)$$

$$\begin{bmatrix} S(x_1 \mid x_1, x_1) & S(x_2 \mid x_1, x_2) & \dots & S(x_N \mid x_1, x_N) \\ 0 & S(x_2 \mid x_2, x_2) & \dots & S(x_N \mid x_2, x_N) \\ \vdots & \ddots & \ddots & \vdots \\ 0 & \dots & 0 & S(x_N \mid x_N, x_N) \end{bmatrix} \quad (B)$$

Computationally, For each variable $x_i$, N sensitivity values could be generated with respect to other variables, $x_1 \dots x_n$. The sensitivity is found from i-th row of matrix A and i-th column of matrix B. FIG. 3 shows the terms which are multiplied. The products of these individual multiplications are not summed together. The result is a vector having N sensitivity values (each corresponding to a respective pairing of device performance parameters). Since this multiplication yields N values, the median value of the various products is determined, to be used as an average for the ranking step which follows.

$$S(x_i \mid x_1 \dots x_N) = \mathrm{median}([S(x_i \mid x_1, x_i), \dots S(x_i \mid x_1, x_N)]) \quad (5)$$

In alternative embodiments, other averages, such as an arithmetic mean or a weighted average may be used. In some embodiments, if the number N is even, so that there are an even number of values for each device performance parameter, then the arithmetic mean of the two center values may be used.

The result is a sensitivity vector having N median sensitivity values, each corresponding to a respective one of the device performance variables. These N values can be ranked, so that their corresponding device performance variables are ranked in order of median sensitivity.

Referring again to FIG. 1, at block 106, for each failure bin, the device performance variables are ranked with respect to sensitivity of the wafer yield measures. Since the sensitivity matrix values are all normalized, the ranking can directly compare the average sensitivities for the different device performance parameters, even if the current device performance target values have different orders of magnitude.

From the vector of N median sensitivity values, a subset including up to a predetermined number of highest ranking device performance variables are selected. For example, in some embodiments, the five device performance variables having the highest median sensitivity are selected.

At block 108, a WAT colinearity check is made for each failure bin. Given the predetermined number (e.g., five) of highest ranking device performance variables in the subset for each failure bin, a correlation coefficient is computed for each respective pair of these device performance variables.

Any of the selected device parameter variables for which a correlation coefficient with respect to a more highly ranked one of the device parameter variables is greater than a threshold value is de-selected (removed from the subset of highly ranked device performance parameters). In some embodiments a threshold value of about 0.7 to about 0.75 is used. If two device performance parameters are highly correlated, then changing the value of one of the two parameters automatically effects a change in the other of the two parameters, so that they cannot be used to independently change the wafer yield.

Figure 4B:
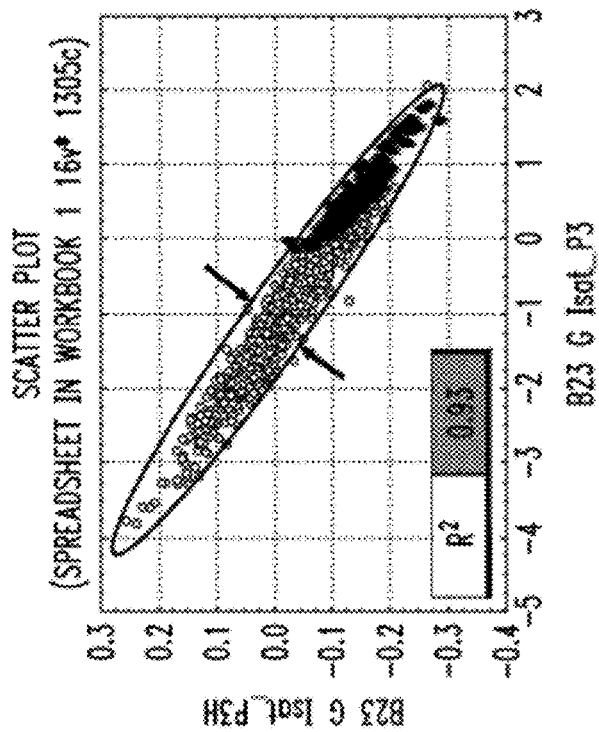
FIGS. 4A and 4B are diagrams showing the gradients of the WAT contour for the data shown in FIGS. 2A and 2B, respectively.
Figure 4A:
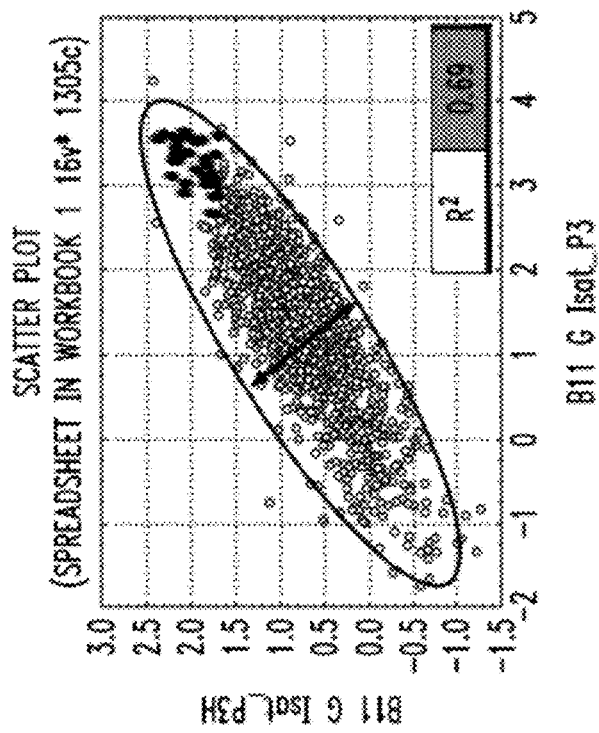

FIGS. 4A and 4B show the colinearity check for the two failure bins of FIGS. 2A and 2B. In FIGS. 4A and 4B, each point represents the gradient of the contour plot failure count function value shown in FIGS. 2A and 2B. FIG. 4A plots the gradient of saturation current for standard versus high Vt transistors, for the speed failure bin. FIG. 4B shows the same variables for the leakage failure bin. The co-linearity check of step 108 (FIG. 1) determines whether the correlation of the points is too high in FIGS. 4A and 4B.

In FIG. 4A, the correlation coefficient $R^2$ for the speed failure bin is 0.69, which is within the threshold used to eliminate closely correlated device performance parameters, so for this failure bin, the saturation current will be retained in the subset of key device performance parameters. Thus, for the speed failure bin, saturation current for standard transistors and saturation current for high Vt transistors are sufficiently independent of each other that both can be retained in the subset for device parameter tuning to improve the yield.

In FIG. 4B, the correlation coefficient $R^2$ for the leakage failure bin is 0.93, which is above the threshold used to eliminate closely correlated device performance parameters, so for this failure bin, the saturation current will be removed (de-selected) from the subset of key device performance parameters. Thus, for the leakage failure bin, saturation current for standard transistors and saturation current for high Vt transistors are highly correlated with each other and only the more highly ranked one of these two device performance parameters will be retained in the subset of key device performance parameters for device parameter tuning to improve the yield. The lower ranked one of these two device performance parameters will be removed (deselected) from the subset.

At block 110, the result of the WAT colinearity check is, for each failure bin, a subset of highly ranked independent device performance parameters which can be used to select new device performance parameter values to improve the wafer yield. This is the set of key device performance parameters to be used for device target tuning.

At the conclusion of step 110, in some instances, a given device performance parameter may be included as a key device performance parameter for every one of the failure bins. In other instances, a given device performance parameter may only be included as a key device performance parameter for fewer than all of the failure bins.

At block 112, a set of regression models is assembled for the subset of key device performance parameters for each failure bin, as identified in block 110. A variety of regression models may be used. The regression models may be the same models used in the first level screening of block 104. Alternatively, the regression model may use response surface modeling.

At block 114, an optimized device performance parameter target value is selected based on the regression models of block 112, taking into account the yield effects across the various failure bins. A variety of optimization techniques may be used. In some embodiments, a preference is given to minimizing total failures (maximizing yield) across failure bins related with the WAT data.

The optimization may take into account a variety of optimization objectives. For example, there are hard constraints due to the limits of the technology node of the process, the capabilities of the process tools, and specifications. In some embodiments, the method seeks the minimum failure rate (maximum yield) within the parameter ranges defined by the hard constraints. In other embodiments, the method seeks the device performance target value that will provide a predetermined yield improvement with the smallest change (distance) to the process parameter value. In another embodiment described below, the total failure function and the process parameter change (distance) function for a given device performance parameter are weighted, and the weighted sum is then minimized.

Figure 5:
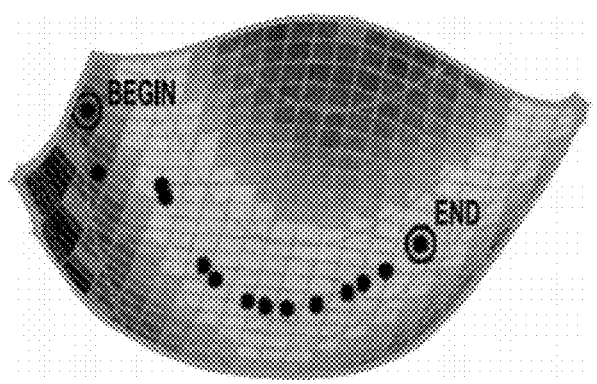
FIG. 5 is a diagram showing a contour generated by combining contours from FIGS. 2A and 2B.

FIG. 5 shows an example of a three dimensional contour formed by combining the failure count functions of equations (1) and (2) for the various bins. (When more failure bins are included in the analysis, additional failure count equations corresponding to each additional failure bin are also included). FIGS. 2A and 2B showed two examples of functions defining the failure count as a function of the saturation current for standard transistors and saturation current for high Vt transistors (defined by equations (1) and (2)). These functions have all been normalized to use a dimensionless sigma scale. Thus, the failure count functions of equations (1) and (2) can be added directly to each other.

Figure 6:
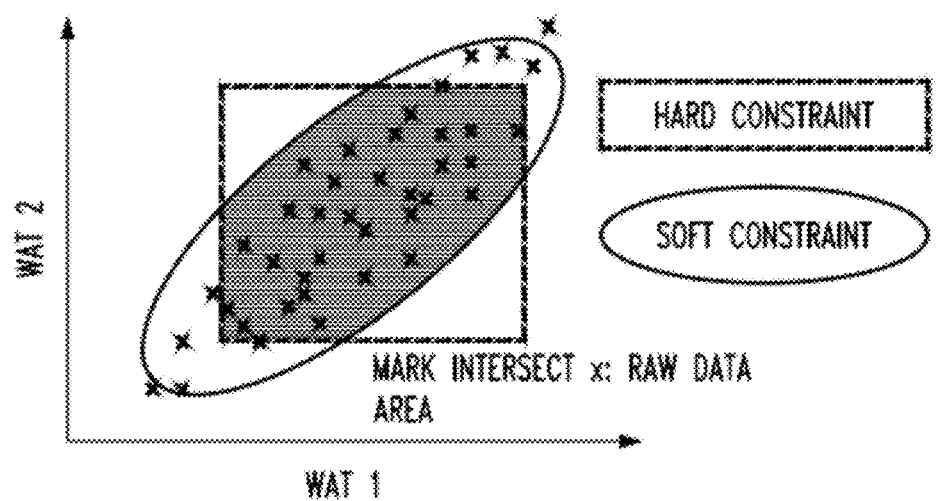
FIG. 6 is a diagram showing optimization, taking into account hard range constraints and preferences based on Mahalanobis distance.

FIG. 6 shows the application of both hard and soft constraints. The hard constraints include the limits of tunable range from user input. The hard constraints place specific limits on the range of values
Lower_Limit≦DeviceTgt≦Upper_Limit In some embodiments, a default setting for the hard constraint is determined by a "2 sigma" rule. According to this constraint, only device performance parameter target changes of two standard deviations or less from the values used during the WAT tests (from which the data were collected) are permitted. This limits the size of changes to the process recipe, to avoid any possible unexpected consequences of large changes.

The soft constraint may include a preferences or weights for minimizing failures and/or for minimizing changes to the process recipe. In some embodiments, a preference of reducing changes is implemented by including a component in the total failure count function based on the Mahalanobis distance of the changed set of performance targets from current set of targets. In some embodiments, a "change penalty" is added to the total failure count for the regression equations (1) and (2); the "change penalty comprises a weighting factor of 0.1 times the Mahalanobis distance.

$$\underset{WAT}{\text{Min}}\left[\sum bin_i + 0.1M \cdot Dist(Tgt)\right] \quad (6)$$

s.t. Lower_Limit≤ $DeviceTgt$ ≤ Upper_Limit

In equation 6, the summation is across the WAT data. The term $bin_i$ indicates summation of the failure count contour functions across all the bins. MDist(Tgt) indicates the Mahalanobis distance of a candidate device performance parameter target from the current target. In some embodiments, a smaller weighting factor may be used for the Mahalanobis distance, to give a greater preference towards minimizing failure rate and a smaller preference towards minimizing parameter changes. In other embodiments, a larger weighting factor may be used for the Mahalanobis distance, to give a greater preference towards minimizing parameter changes.

For a given device performance parameter, once the total of the failure functions (across multiple failure bins) and weighted "change penalties" is determined, the minimum value of the total function over the allowable range is determined as the new device target.

At block 116, a design of experiment (DOE) is performed. Typically, during process development for a new technology node, test data are collected from a plurality of test wafers in a DOE. The DOE tests a variety of feature dimensions and process conditions. These test data are analyzed to determine various relationships between a change in a process parameter and a resulting change in device performance parameter.

For example, at block 116, the relationship between the critical dimension or CD (width) of the polysilicon gate electrode and the resulting saturation current are stored in a table (Inline vs. Device Sensitivity Matrix 118), allowing a quick table lookup to determine a change in the poly CD to achieve a desired change in saturation current.

At block 120, given the optimized device performance parameter(s) of block 114 and the relationships identified in the inline versus device sensitivity matrix of block 118, the method includes performing a table lookup in a table identifying a change in the process parameter that will cause a given change in the one device performance variable. For example, given a new target for saturation current identified by block 114, in block 120 a table look up is performed in the inline vs. device sensitivity matrix 118 to identify a change in the inline process (e.g., change in CD) that can be implemented to achieve the new saturation current target. This become the new optimized inline target. The optimized inline target is an inline target that reduces total failure count across multiple failure bins while giving a preference to targets that minimize change in the process recipe.

The results are used for selecting at least one new process parameter value, based on the combined wafer yield measure. The at least one new process parameter value is subsequently used to process at least one additional wafer. The at least one new process parameter value will effect a change in the one device performance variable.

Once the key device performance parameters and new device target values are computed, the method continues monitoring the behavior of the selected device performance parameter(s). The exemplary method also enables a device behavior monitor mechanism, and can identify key device(s) for troubleshooting and device/inline target calculation during the early stages of production (for fast yield ramp-up). This selection of key device performance parameters minimizes yield impact due to device behavior change (because of process/tool change or drift).

Over time, if devices' behaviors change, the method of FIG. 1 is again executed to re-identify key device performance parameters to be collected in future WAT tests for regression modeling.

Figure 7:
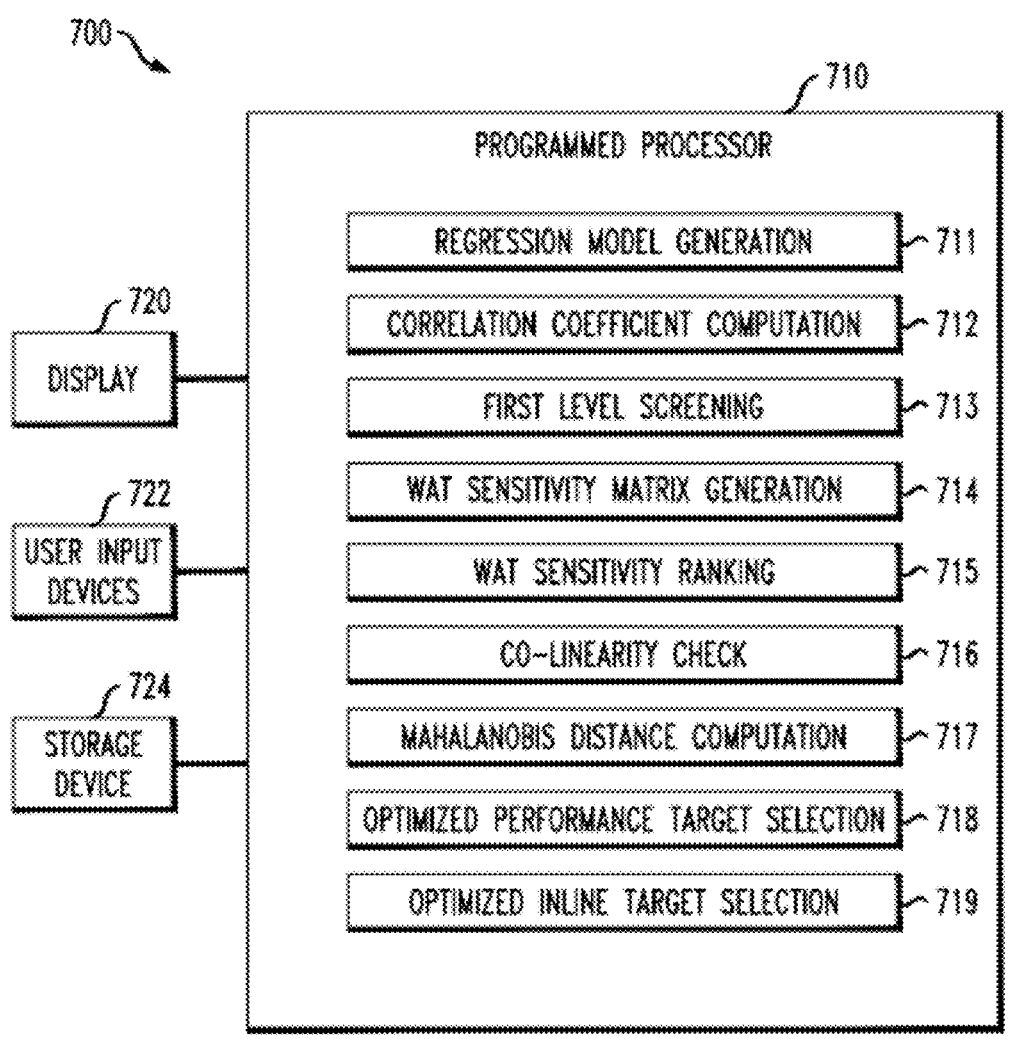
FIG. 7 is a block diagram of a processor system for performing a method described herein.

Many of the calculation steps described above are adapted to be performed using a programmed processor. For example, FIG. 7 shows a processor 710 programmed to perform the method steps. The steps may be performed by a plurality of separate computer programs, or by a program that prompts the user for additional inputs between and/or during steps. These steps may include one or more of the regression model generation 711, correlation coefficient computation 712, first level screening 713, WAT sensitivity matrix generation 714, WAT sensitivity ranking 715, co-linearity check 716, Mahalanobis distance computation 717, optimized target selection 718, and the optimized inline target selection 719. In some embodiments, all of numerically intensive calculations are performed by a programmed processor, and the results presented to the user (e.g., engineer) at certain decision points to allow input of engineering judgment. Although FIG. 7 shows a single processor, in other embodiments, various subsets of the processes 711-719 may be executed on a plurality of programmed processors, which may optionally be connected to each other by a communications network, such as a local area network, a wide area network, and/or the Internet.

Although portions of the method may be implemented on a programmed computer, at one or more points in the method, the processor may prompt a user (e.g., an engineer to input information or a selection. For example, the programmed processor may compute the sensitivity rankings and present a proposed list of device performance parameters to the engineer. The engineer may modify the list (for example, to remove a device performance parameter that is difficult or risky to adjust in practice) and input the modified list to the system.

As another example, when the co-linearity check is performed, and the correlation coefficient information is presented to the engineer, the system may propose a list of independent device performance parameters, which the engineer can modify. The engineer may choose to modify the list to remove or add a highly ranked device performance parameter for which the correlation coefficient with another parameter is close to the threshold. For example, the engineer may choose to include or exclude any parameter have a correlation coefficient with respect to another more highly ranked parameter in the range from 0.7 to 0.75, depending on the engineer's judgment as to the ease or difficulty of improving yield sufficiently using the other remaining device performance process parameters.

In some embodiments, a method comprises computing respective regression models for each of a plurality of failure bins based on a plurality of failures identified during wafer electrical tests. Each regression model outputs a wafer yield measure as a function of a plurality of device performance variables. For each failure bin, sensitivity of the wafer yield measure to each of the plurality of device performance variables is determined, and the device performance variables are ranked with respect to sensitivity of the wafer yield measure. A subset of the device performance variables which have highest rankings and which have less than a threshold correlation with each other are selected. The wafer yield measures for each failure bin corresponding to one of the selected subset of device performance variables are combined, to provide a combined wafer yield measure. At least one new process parameter value is selected to effect a change in the one device performance variable, based on the combined wafer yield measure. The at least one new process parameter value is to be used to process at least one additional wafer.

Reference is again made to FIG. 7, in which one example of a system for performing a method as described above is shown. A system 700 for performing the method may include one or more general purpose computer processors 710 programmed with software to perform the calculation and decision functions described above. The processor is equipped with at least one machine readable storage medium 724, an output display 720 and one or more user input devices, such as keyboard, mouse, touchpad, trackball, touch screen, or the like.

Figure 8:
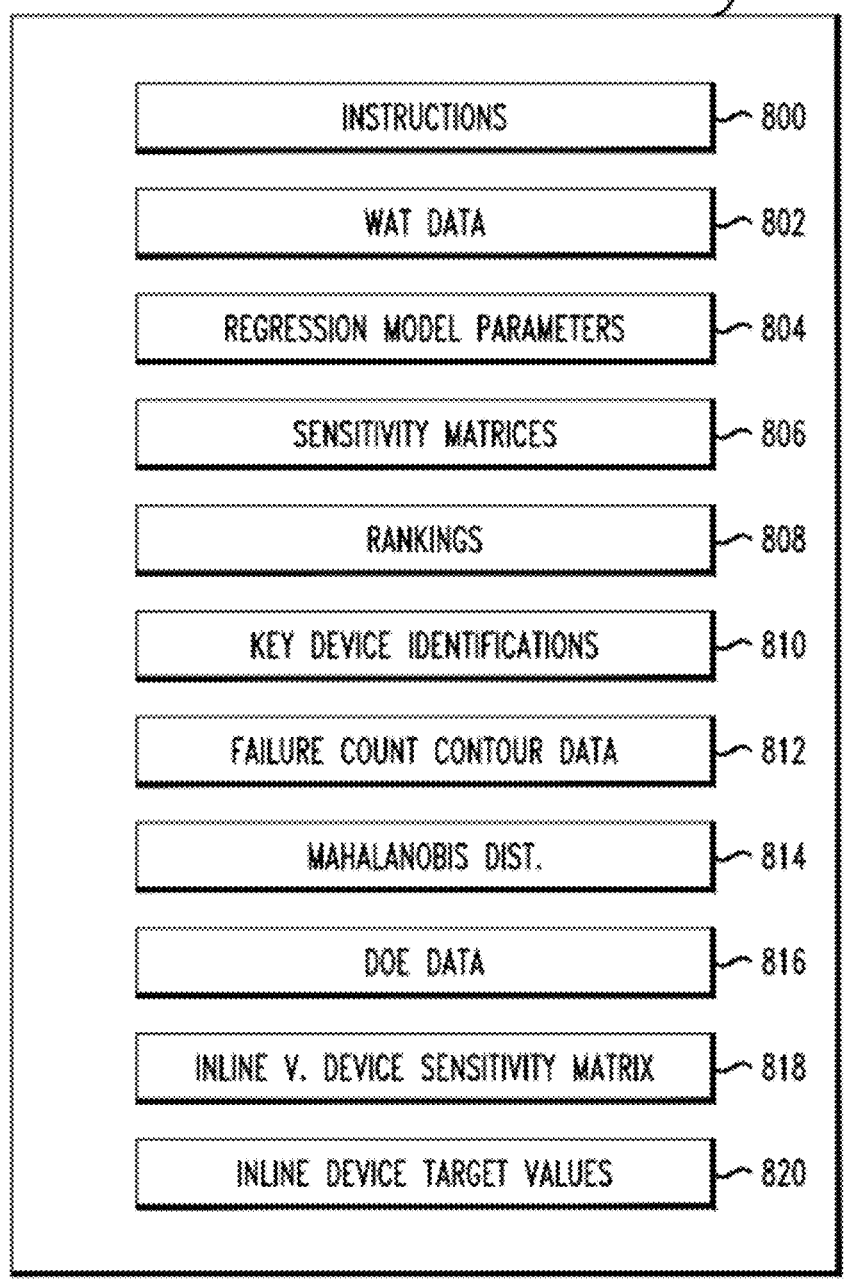
FIG. 8 is a block diagram of the storage device shown in FIG. 7.

Referring now to FIG. 8, the storage device 724 provides storage for program instructions 800, WAT data 802, and intermediate and final calculations for the regression models 804, sensitivity matrices 806, rankings 808, identification of key device performance parameters 810, combined failure count contours 812, Mahalanobis distance computations 814, design of experiment data 816, inline versus device sensitivity matrix 818, and final inline target values 820. The storage device 724 may be a hard disk drive, a solid state memory, an optical storage device (e.g., CD-ROM, DVD-ROM or BD-ROM), or the like. The storage device may include one or more devices configured to store the various instructions and data shown in FIG. 8. The storage device(s) 724 may be co-located with the processor 710 and connected by an I/O interface; alternatively, the storage device 724 may be remotely located from the processor 710, and connected via a communications network (not shown).

The subject matter described herein may be at least partially embodied in the form of computer-implemented processes and apparatus for practicing those processes. The present invention may also be at least partially embodied in the form of computer program code embodied in tangible machine readable storage media, such as random access memory (RAM), read only memories (ROMs), CD-ROMs, DVD-ROMs, BD-ROMs, hard disk drives, flash memories, or any other machine-readable storage medium, wherein, when the computer program code is loaded into and executed by a computer, the computer becomes an apparatus for practicing the invention. When implemented partially or wholly on a general-purpose processor, the computer program code segments configure the processor to create specific logic circuits. The subject matter may alternatively be at least partially embodied in a digital signal processor formed of application specific integrated circuits for performing a method according to the disclosed principles.

Although the subject matter has been described in terms of exemplary embodiments, it is not limited thereto. Rather, the appended claims should be construed broadly, to include other variants and embodiments, which may be made by those skilled in the art.

What is claimed is:

1. A method comprising:
    (a) computing respective regression models for each of a plurality of failure bins based on a plurality of failures identified during wafer electrical tests, each regression model outputting a wafer yield measure as a function of a plurality of device performance variables;
    (b) for each failure bin, determining sensitivity of the wafer yield measure to each of the plurality of device performance variables, and ranking the device performance variables with respect to sensitivity of the wafer yield measure;
    (c) selecting a subset of the device performance variables which have highest rankings and which have less than a threshold correlation with each other;
    (d) combining the wafer yield measures for each failure bin corresponding to one of the selected subset of device performance variables, to provide a combined wafer yield measure;
    (e) selecting at least one new process parameter value to effect a change in the one device performance variable, based on the combined wafer yield measure, the at least one new process parameter value to be used to process at least one additional wafer.

2. The method of claim 1, wherein step (a) includes normalizing the wafer yield measures and values of the device performance variables to a common dimensionless scale.

3. The method of claim 1, wherein the sensitivity of the wafer yield measure to one of the plurality of device performance variables is determined by a partial derivative of the wafer yield measure with respect to that device performance variable, evaluated at an average value of that device performance variable in its respective failure bin.

4. The method of claim 1, wherein step (c) includes:
    selecting up to a first predetermined number of device parameter variables having the highest sensitivities for a given failure bin; and
    de-selecting any of the selected device parameter variables for which a correlation coefficient with respect to a more highly ranked one of the device parameter variables is greater than a threshold value.

5. The method of claim 1, wherein step (d) includes summing the wafer yield measures for each failure bin.

6. The method of claim 5, wherein step (d) further includes adding to the sum of wafer yield measures a component based on a Mahalanobis distance between a given device parameter value and a current device target for that same device parameter.

7. The method of claim 6, wherein the component is computed by multiplying the Mahanobis distance by a weighting coefficient.

8. The method of claim 7, wherein step (e) includes determining a minimum value of the combined wafer yield measure within a tunable range of the device parameter value.

9. The method of claim 8, wherein the range is limited to two standard deviations from a device parameter value used in the wafer electrical tests.

10. The method of claim 1, wherein the combined wafer yield measure gives a preference to new process parameter values that are close to a current value of the same process parameter.

11. The method of claim 1, wherein step (e) includes:
selecting a new value of the one device performance variable, and
identifying a process parameter value corresponding to the new value of the one device performance variable to be the at least one new process parameter value.

12. The method of claim 11, wherein:
the step of identifying the process parameter includes performing a table lookup in a table identifying a change in the process parameter that will cause a given change in the one device performance variable; and
the table is based on data previously collected from a test wafer during a design of experiment specific to a process technology of the wafer.

13. The method of claim 1, further comprising, before step (a):
performing the wafer electrical tests on a plurality of semiconductor wafers and identifying the respective failures of some of the wafers to satisfy a plurality of performance objectives in the wafer electrical tests; and
assigning the identified failures to respective ones of the failure bins according to which performance objective was not met by a given one of the wafers.

* * * * *